United States Patent [19]
Sakaguchi

[11] Patent Number: 6,058,502
[45] Date of Patent: May 2, 2000

[54] DIAGNOSTIC SYSTEM ANALYZING FREQUENCY SPECTRUM OF ELECTRIC POWER FOR DIAGNOSING INTEGRATED CIRCUIT, METHOD AND INFORMATION STORAGE MEDIUM STORING COMPUTER PROGRAM FOR THE METHOD

[75] Inventor: Kazuhiro Sakaguchi, Tokyo, Japan

[73] Assignee: NEC Corporation, Tokyo, Japan

[21] Appl. No.: 09/145,236

[22] Filed: Sep. 1, 1998

[30] Foreign Application Priority Data

Sep. 3, 1997 [JP] Japan .................................. 9-237571

[51] Int. Cl.[7] .............................. G06F 11/00; G06F 13/28
[52] U.S. Cl. ............................ 714/811; 714/22; 714/738; 713/340
[58] Field of Search ........................................ 714/724, 811, 714/819, 820, 738, 14, 22; 713/300, 330, 340

[56] References Cited

U.S. PATENT DOCUMENTS 5,301,334  4/1994  Horiuchi ................................ 713/330
5,802,379  9/1998  Boatwright et al. ..................... 713/324
5,951,681  9/1999  Chang .......................................... 713/1
5,996,079  11/1999  Klein ....................................... 713/300

FOREIGN PATENT DOCUMENTS 6-118131   4/1994   Japan .

*Primary Examiner*—Christine L. Tu
*Attorney, Agent, or Firm*—Young & Thompson

[57] ABSTRACT

A diagnosis system for a semiconductor integrated circuit repeatedly applies a test pattern at repetition periods so as to measure variation of electric power supplied to the semiconductor integrated circuit, and determines the magnitude of a spectral component at a fundamental frequency equal to the inverse of the repetition period and the magnitude of each spectral component at each harmonic of the fundamental frequency to see whether the spectral components fall within the magnitude ranges observed in an excellent semiconductor integrated circuit device so that the diagnosis is speedy and reliable.

47 Claims, 12 Drawing Sheets

DIAGNOSTIC SYSTEM ANALYZING FREQUENCY SPECTRUM OF ELECTRIC POWER FOR DIAGNOSING INTEGRATED CIRCUIT, METHOD AND INFORMATION STORAGE MEDIUM STORING COMPUTER PROGRAM FOR THE METHOD

FIELD OF THE INVENTION

This invention relates to a diagnosis technology for a semiconductor integrated circuit device and, more particularly, to a diagnosis system diagnosing a semiconductor integrated circuit device, a method of diagnosis and an information storage medium for storing a computer program representative of the method.

DESCRIPTION OF THE RELATED ART

A semiconductor integrated circuit device is subjected to various tests before delivery from the factory to see whether any defect is found in the integrated circuit. The manufacturer guarantees the quality of the semiconductor integrated circuit device on the basis of the diagnosis. Although the diagnosis system is expected to complete the diagnosis in short time period because of reduction in cost, a reliable diagnosis is the important factor.

A complementary transistor, i.e., a series of p-channel field effect transistor and n-channel field effect transistor is a basic circuit component of the integrated circuit, and the complementary transistor consumes an extremely small amount of electric power. While the complementary transistor changes the state, current momentarily flows from a power supply line through the complementary transistor to ground line. For this reason, the prior art diagnosis system checks the signal lines to see whether or not any signal line flows a large amount of current except for the leakage current and the current due to the switching action.

A typical example of the diagnosis system is disclosed in Japanese Patent Publication of Unexamined Application No. 6-118131. According to the Japanese Patent Publication of Unexamined Application, the prior art diagnosis system selects a test signal pattern through a logic simulation, and applies the test signal pattern to a product of the semiconductor integrated circuit device. The prior art diagnosis system monitors the static electric power source current at every test signal pattern address to see whether the amount of current falls within a predetermined range. If the amount of current is within the predetermined range, the prior art diagnosis system determines the product to be non-defective. On the other hand, if the amount of current exceeds the maximum limit of the predetermined range, the prior art diagnosis system determines the product to be defective.

Another prior art diagnosis system monitors the waveform of the electric power to see whether or not the waveform is normal or abnormal. If a product of a semiconductor integrated circuit device contains a fault, the fault affects the electric power consumption during the operation, and, accordingly, modifies the waveform of electric power. For this reason, the second prior art diagnosis system diagnoses the product of the semiconductor integrated circuit device on the basis of the waveform of electric power.

The manufacturer encounters a problem in the first prior art diagnosis system disclosed in the above Japanese Patent Publication of Unexamined Application in the throughput. The first prior art diagnosis system consumes several milliseconds to tens milliseconds for the measurement of the current at each pattern address, and each test signal pattern usually contains tens of thousands pattern addresses. For this reason, the first prior art diagnosis system consumes long time for the diagnosis of each product, and the throughput is quite low.

On the other hand, the manufacturer encounters a problem in the second prior art diagnosis system in low reliability. Parasitic capacitance is usually coupled to the electric power source, and the parasitic capacitance tends to deform the waveform. It is difficult to discriminate a piece of abnormal waveform representative of the fault from the deformed waveform due to the parasitic capacitance, and the diagnosis is not reliable.

SUMMARY OF THE INVENTION

It is therefore an important object of the present invention to provide a diagnosis system, which rapidly accurately diagnoses a product of semiconductor integrated circuit device.

It is also an important object of the present invention to provide a method for rapidly accurately diagnosing a product of semiconductor integrated circuit device.

It is also an important object of the present invention to provide an information storage medium, which stores programmed instructions of the method executed by the diagnosis system.

To accomplish the object, the present invention proposes to diagnose a product on the basis of a frequency spectrum of power current.

In accordance with one aspect of the present invention, there is provided a diagnostic system for diagnosing an integrated circuit comprising a power supplier connected to the integrated circuit and supplying an electric power to circuit components of the integrated circuit, a test signal generator connected to the integrated circuit and applying a test signal pattern to the integrated circuit so as to make the integrated circuit operate, an analyzer connected between the power supplier and the integrated circuit and monitoring an electric power consumed by the integrated circuit so as to determine a frequency spectrum of the electric power consumed by the integrated circuit and having spectral components at predetermined frequencies and a diagnostic unit connected to the analyzer, and comparing the frequency spectrum with a reference frequency spectrum obtained from a non-failure integrated circuit to see whether or not the integrated circuit contains a fault.

In accordance with another aspect of the present invention, there is provided a diagnostic system for diagnosing an integrated circuit having a self-test mode comprising a power supplier connected to the integrated circuit, and supplying an electric power to circuit components of the integrated circuit, an analyzer connected between the power supplier and the integrated circuit and monitoring the electric power so as to determine a frequency spectrum of the electric power consumed by the integrated circuit under application of a test signal pattern in the self-test mode and having spectral components at predetermined frequencies and a diagnostic unit connected to the analyzer, and comparing the frequency spectrum with a reference frequency spectrum obtained from a non-failure integrated circuit to see whether or not the integrated circuit contains a fault.

In accordance with yet another aspect of the present invention, there is provided a method for diagnosing an integrated circuit comprising the steps of applying an electric power to the integrated circuit so as to make circuit components thereof responsive to a test signal pattern, applying the test signal pattern to the integrated circuit so that the integrated circuit operates, determining a frequency spectrum of the electric power consumed by the integrated circuit and comparing the frequency spectrum with a reference frequency spectrum observed in an excellent product to see whether or not the integrated circuit contains a fault.

In accordance with still another aspect of the present invention, there is provided an information storage medium storing a program sequence for diagnosing an integrated circuit comprising the steps of applying an electric power to the integrated circuit so as to make circuit components thereof responsive to a test signal pattern, applying the test signal pattern to the integrated circuit so that the integrated circuit operates, determining a frequency spectrum of the electric power consumed by the integrated circuit and comparing the frequency spectrum with a reference frequency spectrum observed in an excellent product to see whether or not the integrated circuit contains a fault.

BRIEF DESCRIPTION OF THE DRAWINGS

The features and advantages of the diagnosis system, the method and the information storage medium will be more clearly understood from the following description taken in conjunction with the accompanying drawings in which.

PRINCIPLE OF FAULT ANALYSIS

Figure 1:
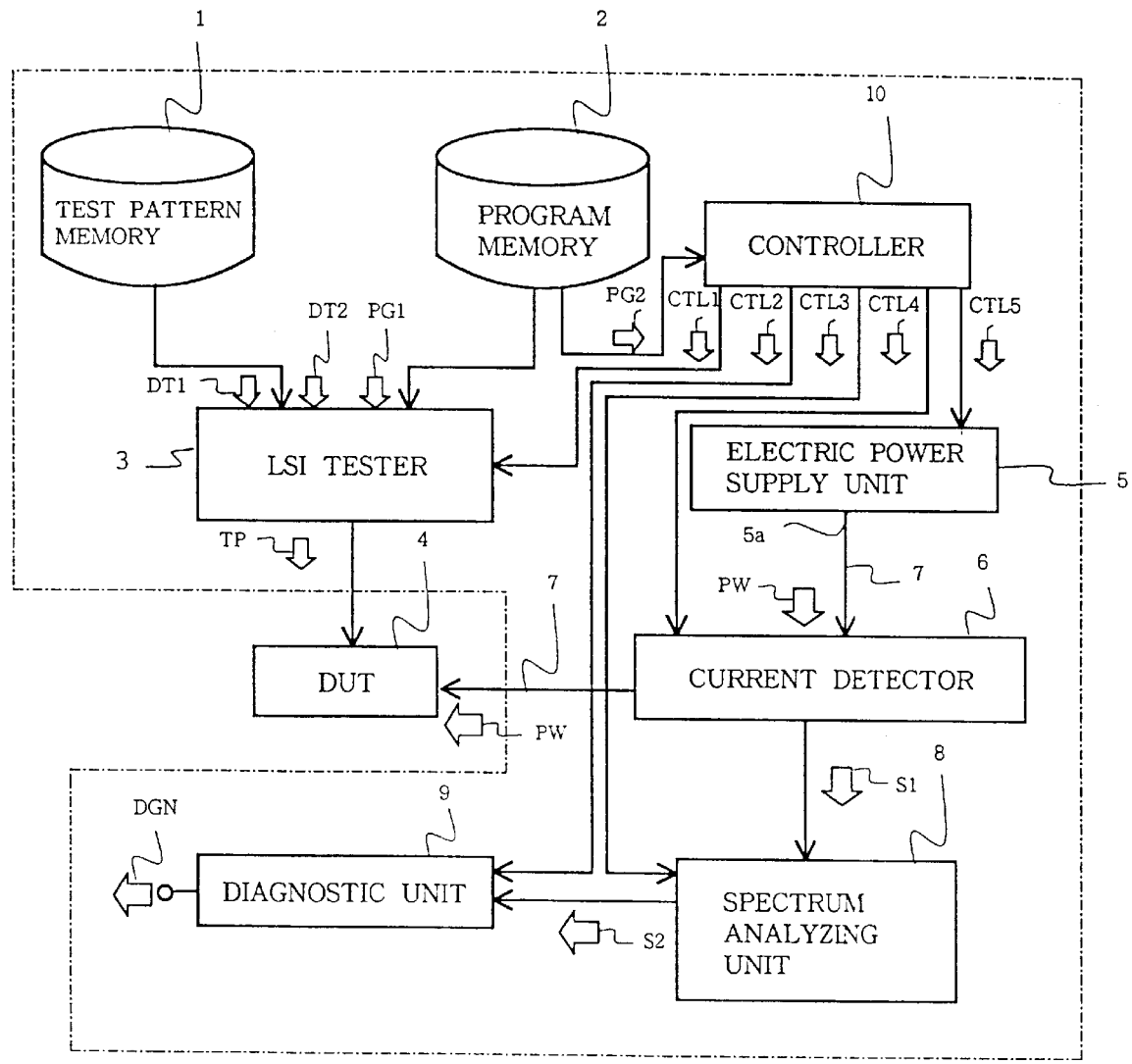
FIG. 1 is a schematic view showing the arrangement of a diagnosis system according to the present invention.

A diagnosis system and a diagnosis method are based on the following discovery. When the present inventor repeatedly applied a test signal pattern to a failure product of a semiconductor integrated circuit device and an excellent product of the semiconductor integrated circuit device, the present inventor noticed that a frequency spectrum of the power current was different between the failure product and the excellent product. When the component transistor was essential circuit components of the semiconductor integrated circuit device, the difference was clear. The difference was derived from the behavior of the electric power current as follows.

The diagnosis system was assumed to repeat the application of the test signal pattern at periods "T". The component transistors of the excellent product responded the test signals so as to sequentially change the potential levels at the common drain nodes thereof. As described hereinbefore, the electric power current flowed through the component transistors at the switching action only. The component transistor consumed the electric power as through-current and electric charge accumulated in or discharged from the parasitic capacitor coupled to the electrodes/ source and drain nodes of the component transistor. This meant that only a negligible amount of was observed on the power supply line during the idle state. When the diagnosis system repeated the application of the test signal pattern at periods "T", the component transistors also repeated the switching action at periods "T", and each component transistor flowed the electric power current at intervals equal to "T". For this reason, the electric power consumption had the fundamental frequency component of 1/T and its harmonics. In other words, the fundamental frequency component and the harmonics formed a frequency spectrum, which was featured by the frequency of 1/T.

On the other hand, when the diagnosis system applied the test signal pattern, the component transistors of the fault product also sequentially changed the potential levels at the common drain nodes, and flowed the electric power current therethrough. The fault product contained a static defect such as, for example, a short-circuit between the signal lines associated with the component transistor, by way of example, and/or a dynamic defect such as, for example, a component transistor switched at an actual timing offset from a target timing. When the associated component was switched, the electric power current flowed into the short circuit, and the fault product momentarily increased the electric power consumption. A particular test signal or a certain lapse of time triggered the switching action of the associated component transistor, and the abnormal current was repeated at periods T. As a result, the fault product had a frequency spectrum different from that of the excellent product due to the electric power current flowing into the short-circuit. The difference was found in the electric power consumption at each frequency, the frequency at the maximum electric power consumption, the peaks of electric power consumption and the dispersion of peaks. Moreover, the excellent product and the fault products had differences in the amount of current at the fundamental frequency of 1/T and/or the amount of current at each harmonic. The present inventor concluded that the fault product was distinguishable from the excellent product.

The frequency spectrum of the excellent product is required for the diagnosis. When the test signal pattern is applied to a product of the semiconductor integrated circuit to be diagnosed, the electric power consumption is measured, and a frequency spectrum is determined. The semiconductor integrated circuit device may have a self-diagnosis mode so that the product enters into the self-diagnosis mode before the application of the test signal pattern. The frequency spectrum of the product is compared with the frequency spectrum of the excellent product so as to determine whether the product is fault or excellent.

DESCRIPTION OF THE PREFERRED EMBODIMENT

Diagnosis System

Referring first to FIG. 1 of the drawings, a diagnosis system embodying the present invention comprises a test pattern memory 1 storing pieces of data information DT1/DT2 for various test signal patterns, a program memory 2 for storing programmed instructions and an LSI (Large Scale Integration) tester 3 connected to the test pattern memory 1 and the programmed memory 2. The programmed instructions form at least two program sequences PG1/PG2. One of the program sequences, i.e., PG1 causes the LSI tester 3 to produce test signal patterns TP from the pieces of data information DT1. The pieces of data information DT2 are representative of application of test pattern. The other program sequence PG2 is used for controlling components of the system as will be described hereinlater. Any kind of non-volatile memory such as a floppy disk, a magnetic disk or a CD-ROM is available for the program memory. Otherwise, the program sequences PG1/PG2 may be loaded from an external program source.

The LSI tester 3 sequentially executes the instructions of the program sequence PG1 so as to apply selected test pattern or patterns TP to signal pins of a semiconductor integrated circuit device 4. The semiconductor integrated circuit device 4 is labeled with "DUT (Device Under Test)" in FIG. 1. The component transistor is a basic circuit component of the integrated circuit, and the integrated circuit is subjected to tests. However, the semiconductor integrated circuit device is not limited to the integrated circuit implemented by the component transistors. A field effect transistor or a bipolar transistor may be the basic circuit component. Though not shown in FIG. 1, a test board is provided between the LSI tester 3 and the semiconductor integrated circuit device 4 so as to electrically connect the LSI tester 3 to the semiconductor integrated circuit device 4. The LSI tester 3 consumes time period T for applying the test signal pattern to the signal pins. The test signal pattern may be repeatedly applied to the semiconductor integrated circuit device 4 at periods T. The period T is either constant or variable with time. If the period T is variable, it becomes longer with time or shorter with time. Thus, the LSI tester 3 can apply the test signal pattern or patterns TP to the semiconductor integrated circuit device 4 in different ways. The LSI tester 3 selects one of the different ways on the basis of the pieces of data information DT2.

The diagnosis system further comprises an electric power supply unit 5 and a current detector 6 inserted in an electric power supply line 7 between the electric power supply unit 5 and the test board (not shown). The electric power supply unit 5 keeps the voltage at the output terminal 5a constant, and electric power current flows through the electric power supply line 7 and the test board to the semiconductor integrated circuit device 4. Thus, the electric power PW is supplied to a power supply terminal of the semiconductor integrated circuit device 4. The semiconductor integrated circuit device 4 may have other terminals supplied with the electric power PW. The electric power supply unit 5 may be a kind of controlled power supply unit, and the voltage at the output terminal 5a is controlled by a built-in controller or a controller described hereinlater.

Figure 2:
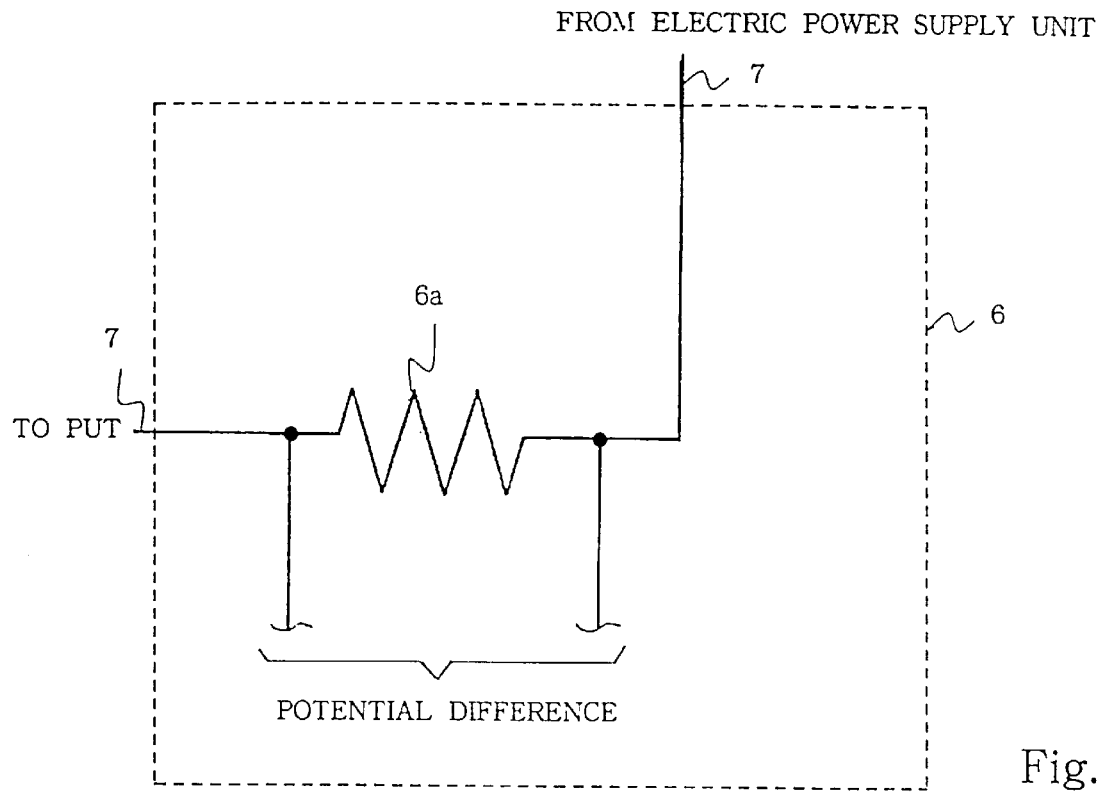
FIG. 2 is a circuit diagram showing essential part of a current detector incorporated in the diagnosis system.

FIG. 2 illustrates the current detector 6. The current detector 6 has a resistor 6a inserted in the power supply line 7, and the resistor 6a offers resistance of the order of 100 ohms, by way of example. When the electric power current flows through the resistor 6a, the resistor 6a produces a potential difference between both ends thereof, and the amount of current is converted the potential difference. The potential difference is proportional to the amount of current, and serves as the data signal S1. Thus, the current detector 6 has the simple configuration.

Figure 3:
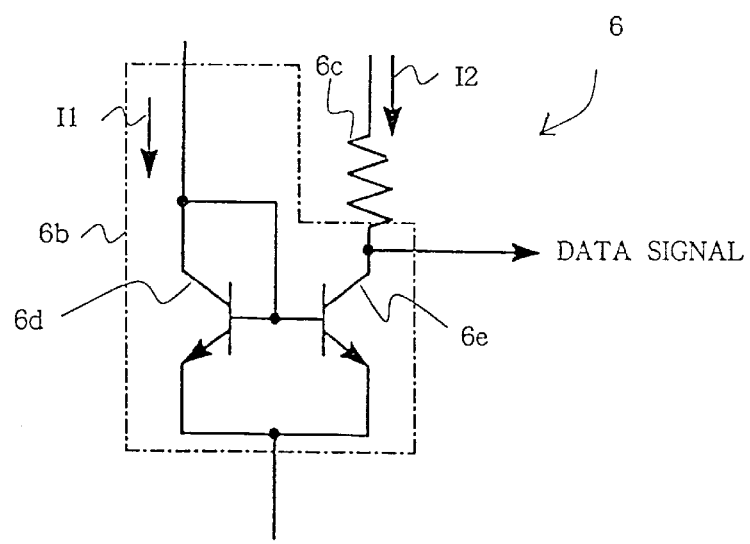
FIG. 3 is a circuit diagram showing essential part of another current detector.

The current detector 6 may have a current mirror circuit 6b and a resistor 6c as shown in FIG. 3. The current mirror circuit 6b is implemented by bipolar transistors 6d/6e, and the electric power current I1 is supplied to the bipolar transistor 6d. The base node of the bipolar transistor 6d is connected to the base node of the other bipolar transistor 6e, and the bipolar transistors 6d/6e proportionally vary the collector current. For this reason, the amount of electric power current I1 is transferred to the amount of current I2, and the resistor 6c converts the current I2 to the data signal.

Figure 4:
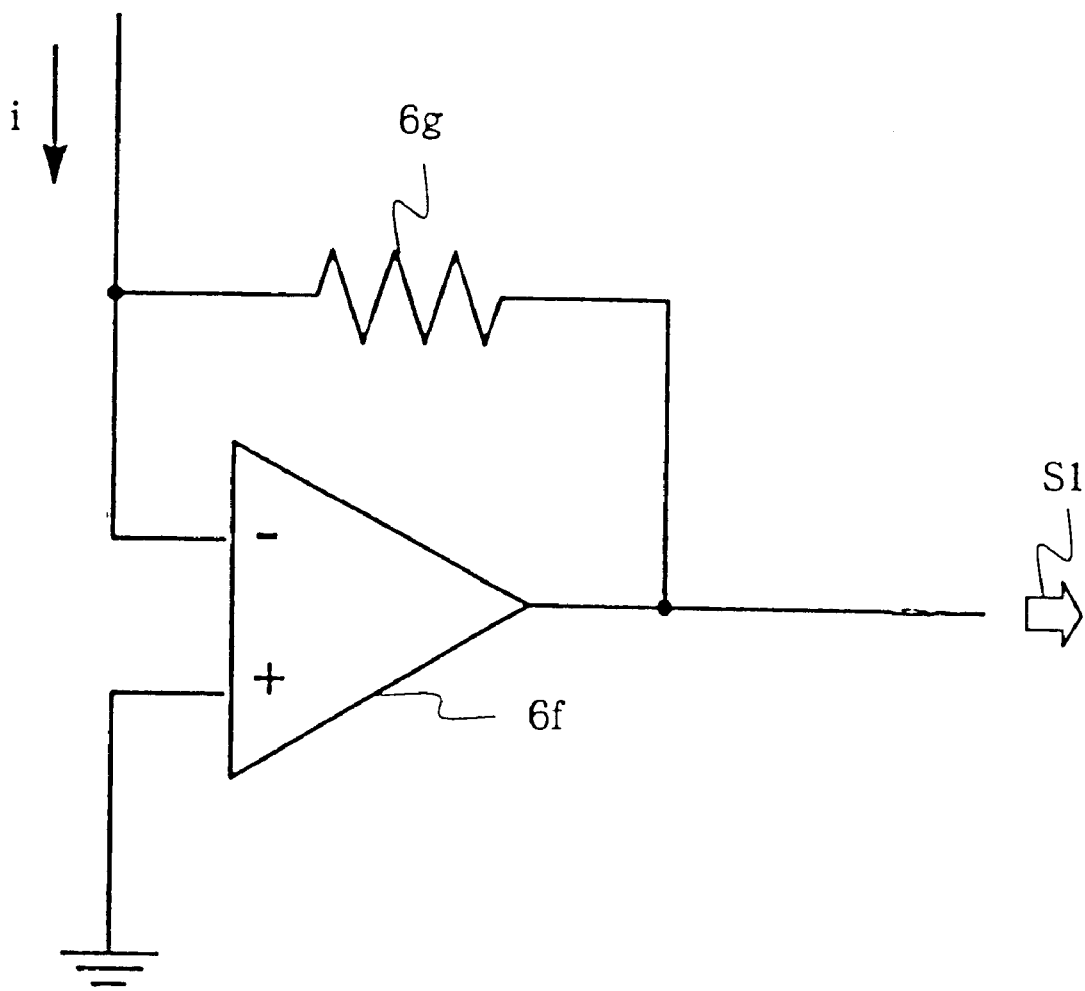
FIG. 4 is a circuit diagram showing essential part of yet another current detector.

The current detector 6 may have an operational amplifier 6f and a resistor 6g as shown in FIG. 4. The operational amplifier 6f and the resistor 6g serve as an amplifier, and the resistor 6g offers resistance Rf. When current i flows, the operational amplifier produces the data signal S1, and the magnitude of the data signal S1 is equal to the product, i.e., $-i \times Rf$.

The diagnosis system further comprises a spectrum analyzing unit 8 connected to the current detector 6 and a diagnostic unit 9 connected to the spectrum analyzing unit 8. The detecting signal S1 is supplied to the spectrum analyzing unit 8, and the spectrum analyzing unit 8 determines a frequency spectrum of the electric power PW. The spectrum analyzing unit 8 determines the magnitude of spectral power at the fundamental frequency 1/T and the neighborhood thereof and the magnitude of spectral power at each of the harmonics and the neighborhood thereof, and produces a data signal S2 representative of the frequency spectrum of the electric power PW. The data signal S2 is supplied from the spectrum analyzer 8 to the diagnostic unit 9, and the diagnostic unit 9 diagnoses the semiconductor integrated circuit device 4 on the basis of the frequency spectrum of the electric power W. The diagnostic unit 9 may diagnose the product 4 on the basis of lack of a peak, unexpected peak, an offset of a peak from a predetermined frequency and unexpected spectral powers at the peaks of the frequency spectrum.

Figure 5:
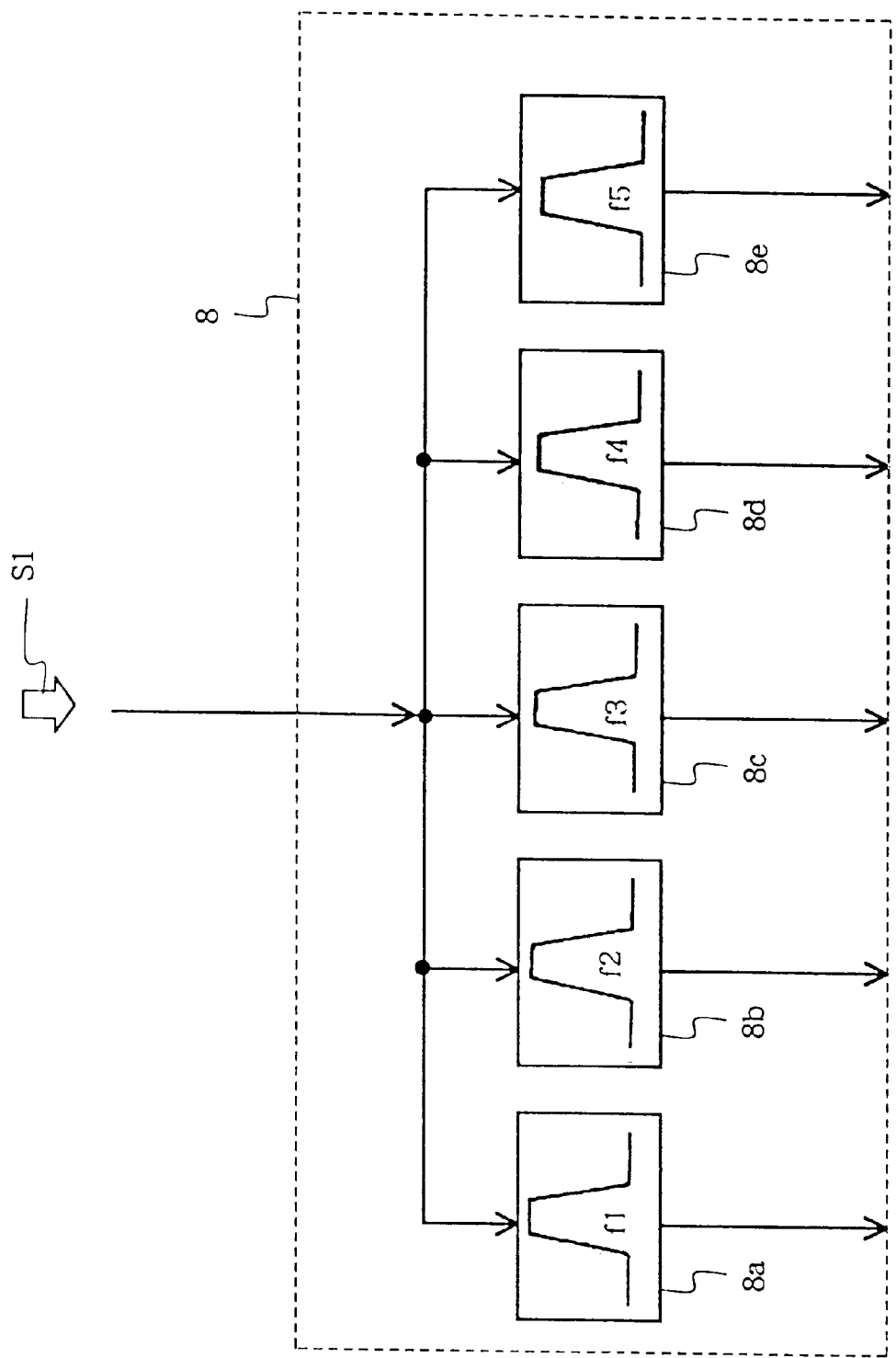
FIG. 5 is a block diagram showing the circuit configuration of a spectrum analyzing unit incorporated in the diagnosis system.
Figure 6:
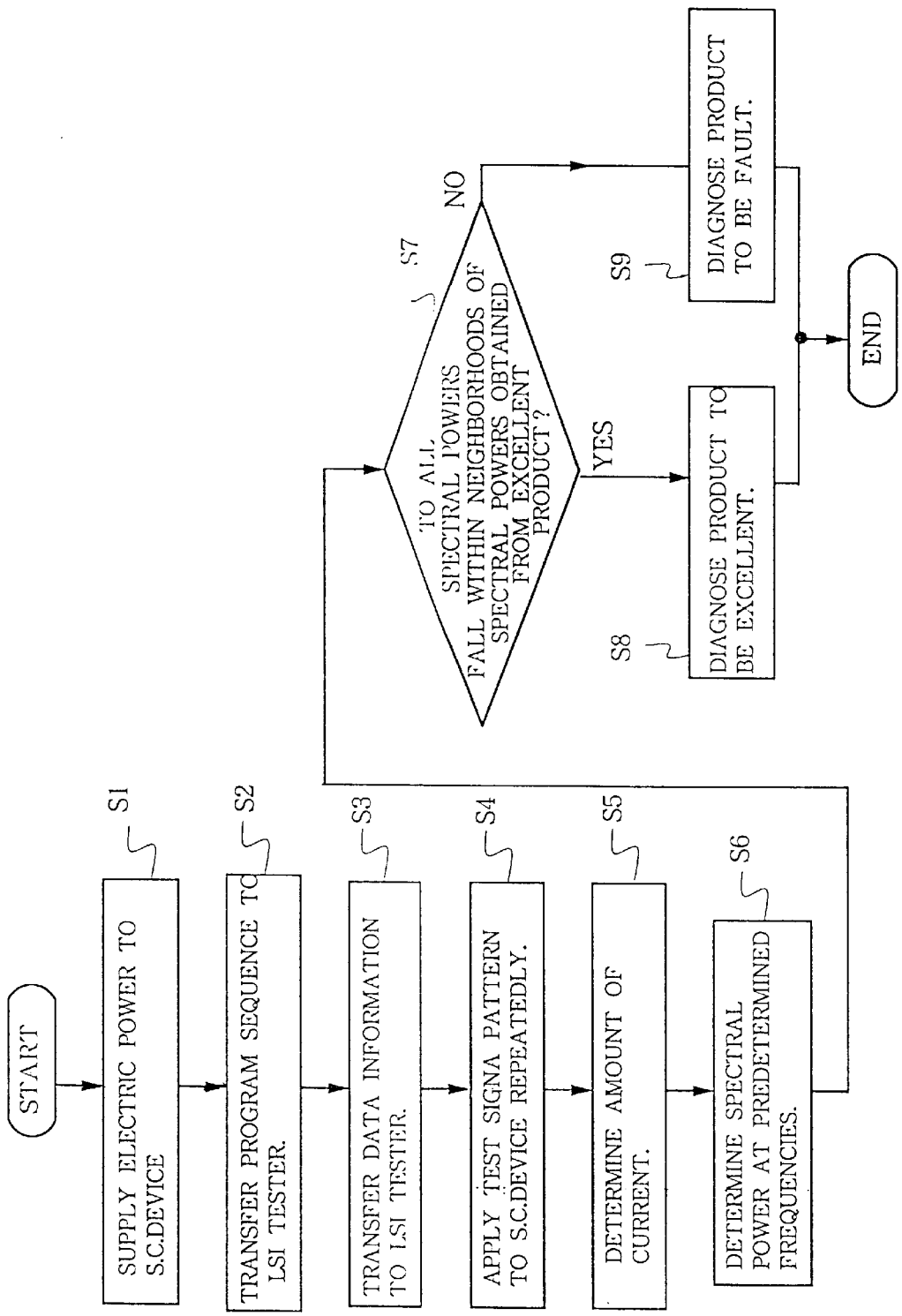
FIG. 6 is a flowchart showing a method for diagnosing a semiconductor integrated circuit device.

FIG. 5 illustrates the circuit configuration of the spectrum analyzing unit 8. The spectrum analyzing unit 8 includes plural band-pass filters 8a/8b/8c/8d/8e, and the band-pass filters 8a to 8e are different in passband from one another. In this instance, the passbands are indicated by f1, f2, f3, f4 and f5, respectively. The band-pass filters 8a to 8e are arranged in parallel, and the data signal S1 is supplied in parallel to the band-pass filters 8a to 8e. The band-pass filters 8a to 8e respectively pass the frequency components f1/f2/f3/f4/f5, and the magnitude of each frequency components f1 to f5 is used—as the spectral power in the diagnosis. Thus, the spectrum analyzing unit 8 is simple. The time period T is of the order of several milliseconds to tens milliseconds, and is much longer than the clock period of the test signals TS applied at several M-Hz. For this reason, the highest passband is of the order of several KHz.

The spectrum analyzing unit 8 may be implemented by a spectrum analyzer or a fast Fourier transformer. The fast Fourier transformer samples the electric power current at a predetermined timing, and carries out the spectrum analysis for the sample. For this reason, the LSI tester 3 is expected to apply the test signal pattern TP once. As a result, the diagnosis merely consumes short time, and the throughput is improved.

The diagnostic unit 9 may include an analog-to-digital converter, a memory and digital comparators. In this instance, the spectral powers of an excellent product are stored in the memory in the form of digital code, and the data signal S2 representative of the magnitudes of frequency components is converted to digital data signals. The digital signals are compared with the digital codes for the diagnosis.

The diagnostic system further comprises a controller 10 connected to the program memory 2, the LSI tester 3, the current detector 6, the spectrum analyzer 8, the diagnostic unit 9 and the electric power supply unit 5. The controller 10 sequentially fetches the instructions of the program sequence PG2, and produces control signals CTL1, CTL2, CTL3, CTL4 and CTL5 at appropriate timings. The control signals CTL1/CTL2/CTL3/CTL4/CTL5 are supplied to the LSI tester 3, the diagnostic unit 9, the spectrum analyzing unit 8, the current detector 6 and the electric power supply unit 5, respectively. Thus, the system components 3/5/6/8/9 cooperate with one another, and produce a diagnosis DGN for the semiconductor integrated circuit device 4.

In the embodiment described hereinbefore, the LSI tester 3, the test pattern memory 1, the program memory 2 as a whole constitute a test signal generator, and the electric power supply unit 5 and the power supply line 7 form in combination a power supplier. The current detector 6 and the spectrum analyzing unit 8 as a whole constitute an analyzer.

Method for Diagnosis

FIG. 2 illustrates a method of diagnosing the semiconductor integrated circuit device. First, a product of the semiconductor integrated circuit device 4 is mounted on the test board (not shown), and the signal pins and the power supply pins are connected to the LSI tester 3 and the power supply line 7, respectively. A predetermined signal pin may be connected to the power supply line 7. In this instance, the electric power supply unit 5 keeps the potential level at the output terminal 5a constant. In another embodiment, the electric power supply unit 5 may vary the potential level at the output terminal 5a along a predetermined path.

The controller 10 firstly activates the system components 1, 2, 3, 5, 6, 8, and 9, and instructs the electric power supply unit 6 to supply the electric power PW through the power supply line 7 to the power supply pins of the product 4. The electric power PW is supplied through the current detector 6 and the power supply line 7 to the power supply pins as by step S1, and the electric power PW is distributed to the circuit components of the product 4. Then, the integrated circuit enters into ready for testing state.

Subsequently, the controller 10 instructs the LSI tester 3 to produce the test signal pattern TP. The LSI tester 3 requests the program memory 2 to supply the program sequence PG1. The program memory 2 supplies the program sequence PG1 to the LSI tester 3 as by step S2, and the programmed instructions of the sequence PG1 are stored in the internal memory (not shown). The LSI tester 3 starts to sequentially execute the programmed instructions, and requests the test pattern memory 1 to supply the pieces of data information DT1/DT2. The pieces of data information DT1/DT2 are transferred from the test pattern memory 1 to the LSI tester 3 as by step S3, and are stored in the internal memory of the LSI tester 3. The LSI tester 3 produces the test signal pattern TP from the pieces of data information DT, and applies the test signal pattern TP to the product 4 in a manner specified by the pieces of data information DT2 as by step S4. In this instance, the pieces of data information DT2 are representative of repetition of the test signal pattern TP. Although the step S1 is earlier than the step 2 in the flowchart, the controller 10 may concurrently instruct the electric power supply unit 5 and the LSI tester 3 to execute step S1 and steps S2–S4 in so far as the product 4 is powered before application of the test signal pattern TP.

The integrated circuit is responsive to the test signal pattern TP so as to sequentially produce internal signals, and the circuit components such as the component transistors consumes the electric power PW. For this reason, the amount of electric power PW is varied depending upon the switching actions of the circuit components.

The electric power current flows into the current detector 6, and the current detector 6 determines the amount of current as by step S5. The current detector 6 produces the data signal S1 representative of the value of electric power current. The data signal S1 is supplied from the current detector 6 to the spectrum analyzing unit 8.

Figure 7:
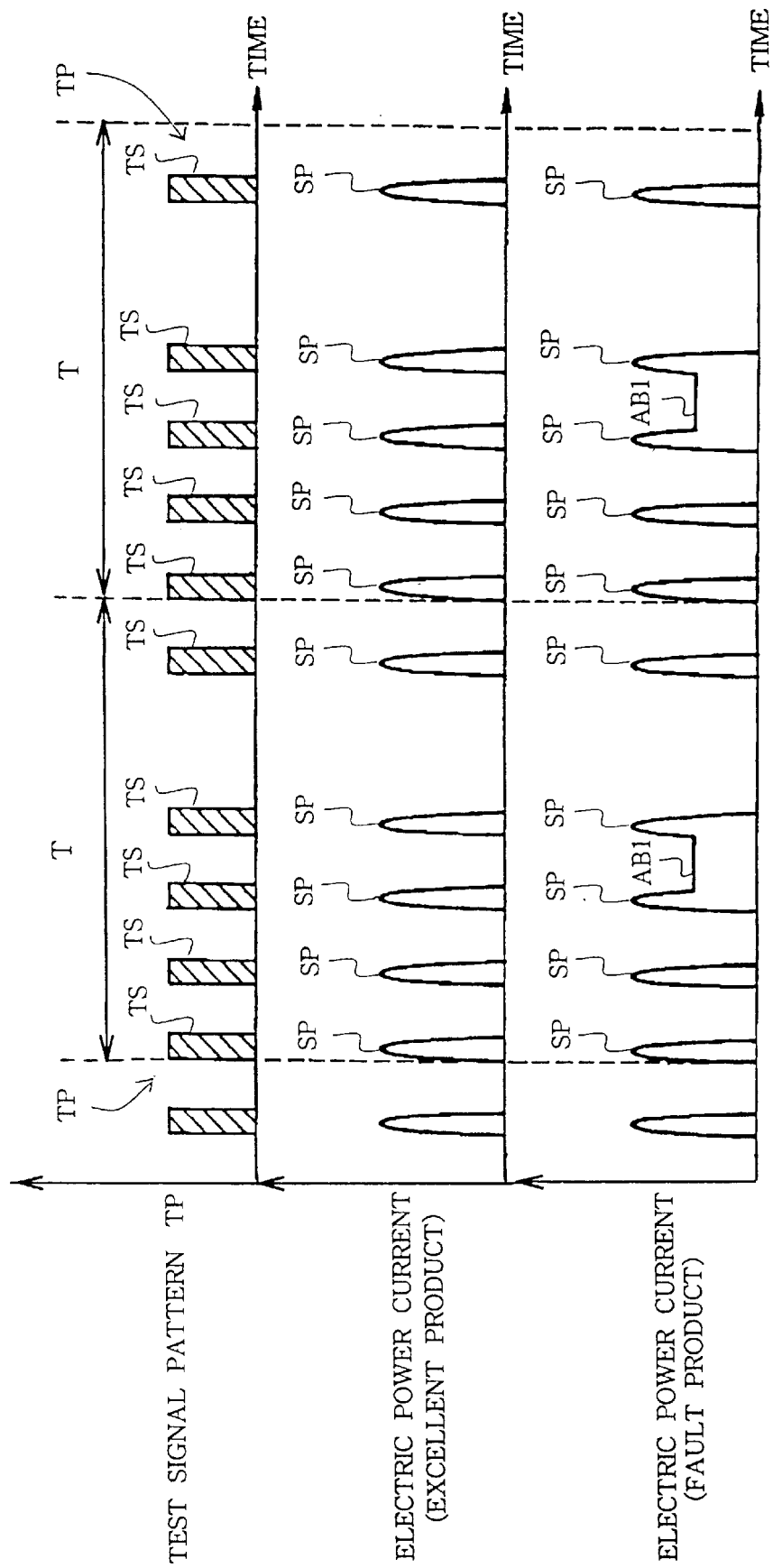
FIG. 7 is a graph showing variation of current on an electric power supply line.
Figure 8:
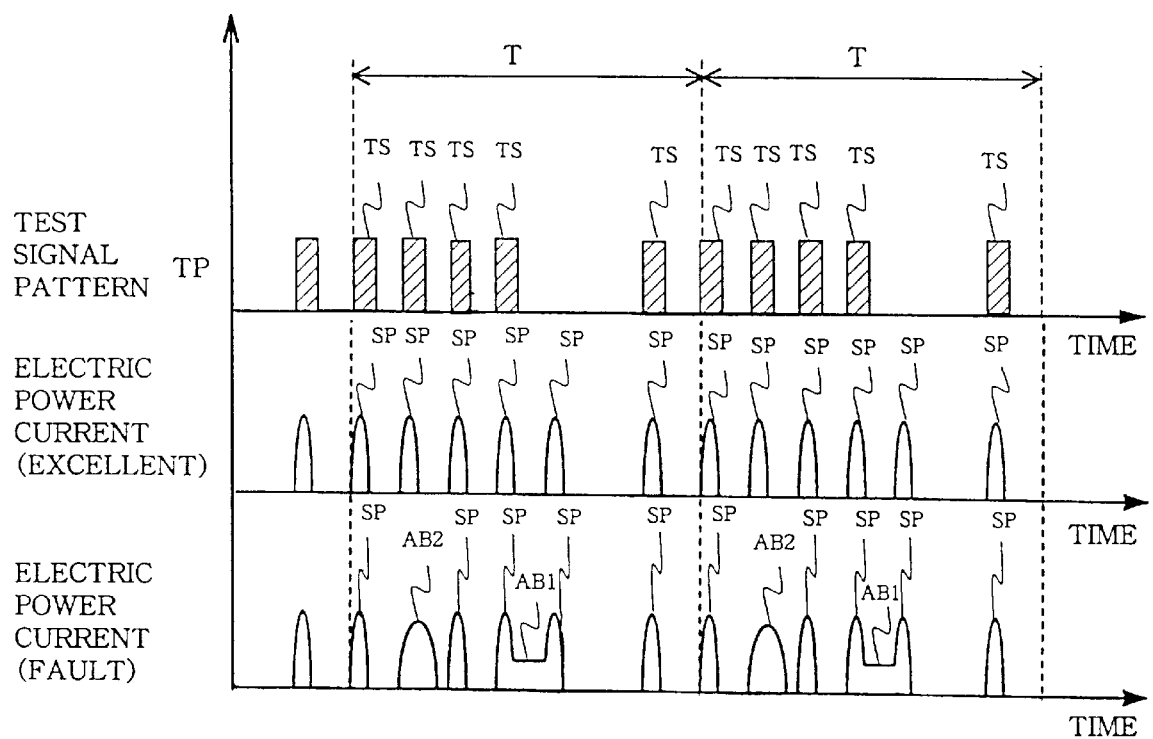
FIG. 8 is a graph showing another variation of current on the electric power supply line.

FIG. 7 illustrates the electric power current observed in an excellent product and the electric power current observed in a fault product. The test signal pattern TP consists of plural test signals TS, and the test signals TS are sequentially applied to the product 4 over period T. In this instance, the test signal pattern TP is repeatedly applied to the product 4. The integrated circuit is responsive to the test signals TS, and consumes the electric power PW. The component transistors consume the electric power PW during the switching action only, and the electric power current is observed at the application timings of the test signals TS. If the product 4 is excellent, the electric power current periodically flows like spikes SP in synchronism with the test signals TS, and any current does not flow between the test signals TS. However, if the product 4 is fault, the electric power current AB1 flows between the third test signal TS and the fourth test signal TS, and the abnormal current AB1 is observed at periods T. A short-circuit between signal lines is, by way of example, causative of the abnormal current AB1, and is called as "static abnormal current". The static abnormal current AB1 is further derived from a delay trouble and an open trouble. If a component transistor is defective, the switching action is offset from a predetermined timing, and dynamic abnormal current AB2 flows at periods T as shown in FIG. 8. The dynamic abnormal current AB2 is continued longer than the normal electric power current SP, and is also discriminative. If the fault product has plural defects, the static/dynamic abnormal current AB1/AB2 is observed more than once. An analyst can specify the static/dynamic abnormal currents AB1/AB2. The static/dynamic current AB1/AB2 repeatedly flows at a certain timing in the period T, and the certain timing relates to a certain test signal TS.

The spectrum analyzing unit 8 makes a frequency spectrum analysis of the current values, and determines the spectral power at the predetermined frequencies as by step S6. The spectrum analyzing unit 8 produces the data signal S2 representative of the spectral powers, and supplies the data signal S2 to the diagnostic unit 9. The predetermined frequencies are the fundamental frequency 1/T and the harmonics thereof, i.e., 2/T, 3/T, . . . .

Figure 9:
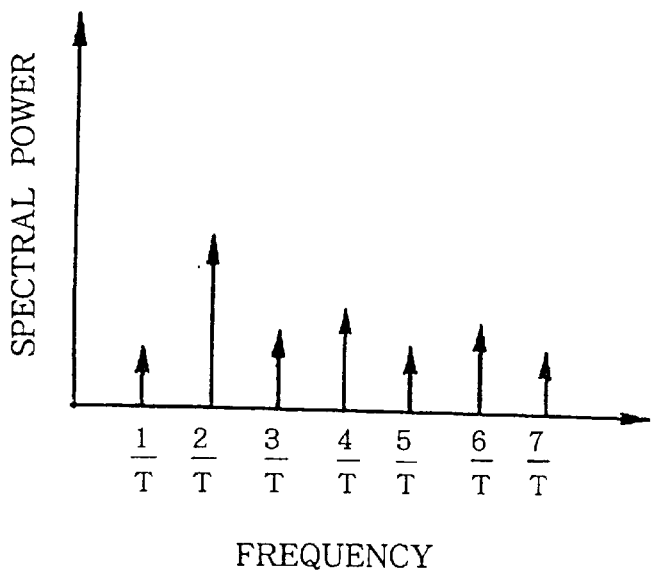
FIG. 9 is a graph showing spectral powers of an excellent product determined on the basis of the variation of current.
Figure 10:
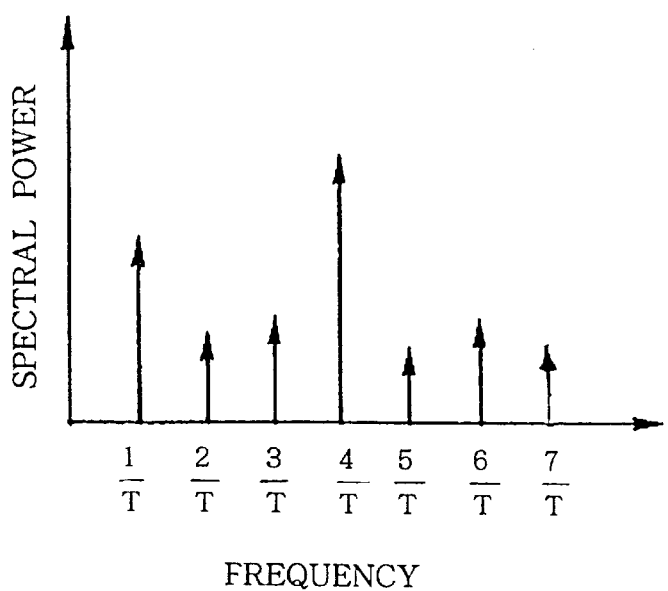
FIG. 10 is a graph showing spectral powers of a fault product determined on the basis of the variation of current.

When the electric power current is observed as shown in FIG. 7, the spectral analyzing unit 8 determines the spectral power at each frequency as shown in FIGS. 9 and 10. FIG. 9 illustrates the frequency spectrum obtained in the excellent product, and FIG. 10 illustrates the frequency spectrum observed in the fault product. Each test signal TS causes the electric power current to flow at periods T, and the electric power current has the fundamental frequency component at 1/T and the harmonic components at 2/T, 3/T . . . . When the product 4 is excellent, the fundamental frequency component and the harmonic components are observed as shown in FIG. 9. However, the defect causes the abnormal current AB1 to flow, and the abnormal current AB1 affects the fundamental frequency component and the harmonic components. The fundamental frequency component is increased, and the frequency spectrum of the fault product is different from that of the excellent product as shown in FIG. 10.

If the electric power current contains the dynamic abnormal current AB2, the dynamic abnormal current AB2 also affects the frequency spectrum, and the frequency spectrum becomes different from that of the excellent products. Of course, when both static and dynamic abnormal currents AB1/AB2 are mixed with the normal power current SP (see FIG. 8), the static abnormal current AB1 and the dynamic abnormal current AB2 affect the frequency spectrum, and make the frequency spectrum different from that of the excellent products.

If a field effect transistor or a bipolar transistor forms a digital circuit or an analog circuit, the abnormal currents AB1/AB2 are observed due to a defect and a defective transistor, and the frequency spectrum becomes different from that of an excellent product.

The diagnostic unit 9 stores the spectral powers at the predetermined frequencies to be observed in excellent products of the semiconductor integrated circuit device. The diagnostic unit 9 compares the spectral powers of the product 4 with the spectral powers of the excellent products to see whether or not the spectral powers fall within the neighborhoods of the spectral powers of the excellent product as by step S7. The frequency spectra shown in FIGS. 9 and 10 are quite different from one another, and the fault product is discriminative. If the answer at step S7 is given affirmative, the diagnostic unit 9 determines the product 4 to be excellent as by step S8. On the other hand, if the answer at step S7 is given negative, the diagnostic unit 9 determines the product 4 to be fault as by step S9.

Figure 11:
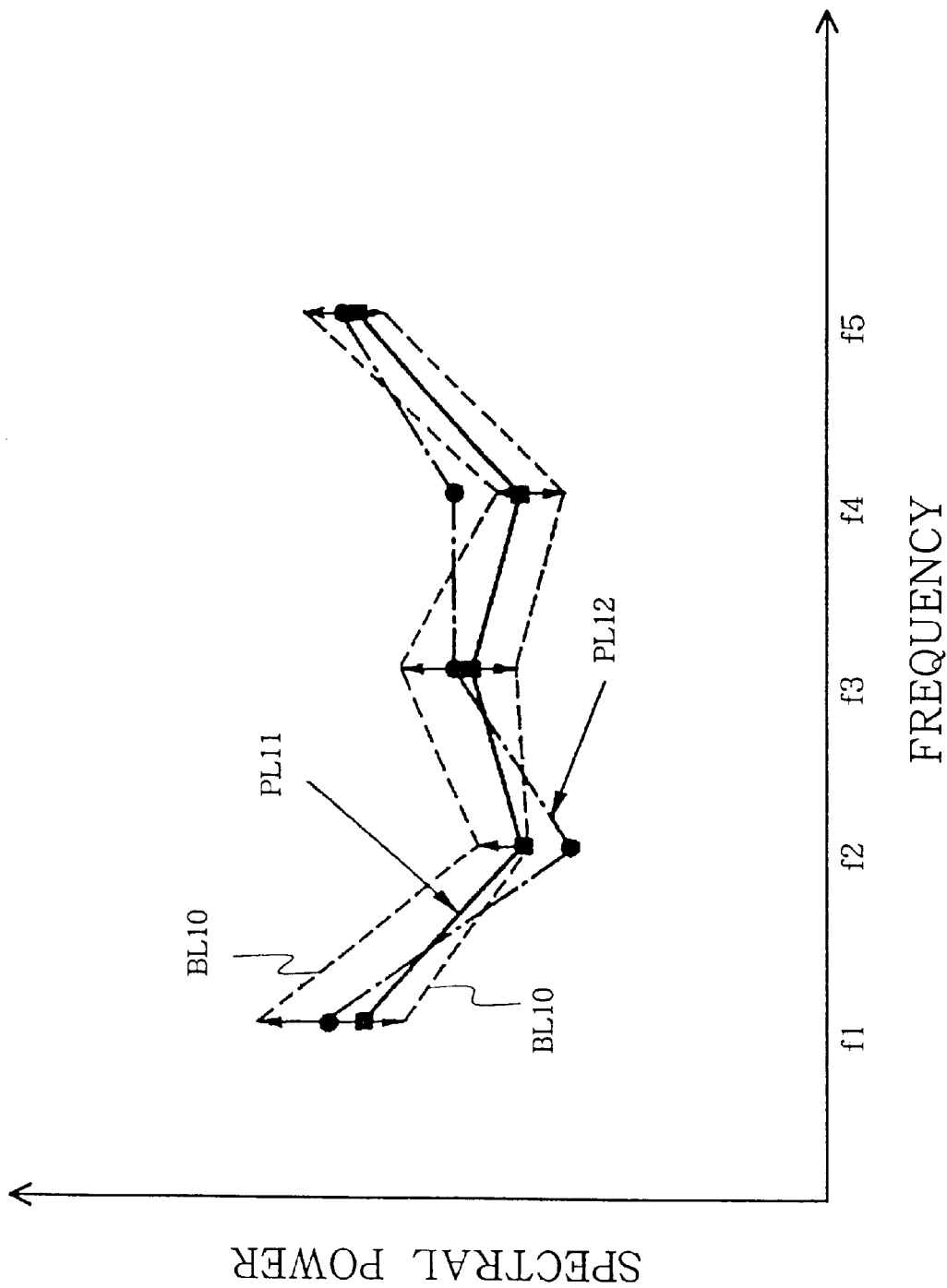
FIG. 11 is a graph showing a frequency spectrum obtained from an excellent product and another frequency spectrum obtained from a fault product.

FIG. 11 illustrates frequency spectra determined by the spectrum analyzing unit 8. Broken lines BL11 indicate the neighborhoods of spectral powers obtained from excellent products, and plots PL11 and PLI2 are indicative of the frequency spectrum obtained from the product 4 diagnosed to be excellent and the frequency spectrum obtained from the product 4 diagnosed to be fault. All the spectral powers on plots PL11 falls within the range indicated by broken lines BL11. However, the frequency spectrum indicated by plots PLI2 has the spectral powers outside of the range at frequencies f2/f4. Thus, the diagnostic unit 9 diagnoses the product 4 to be fault on the basis of at least one spectral power outside of the range.

Figure 12:
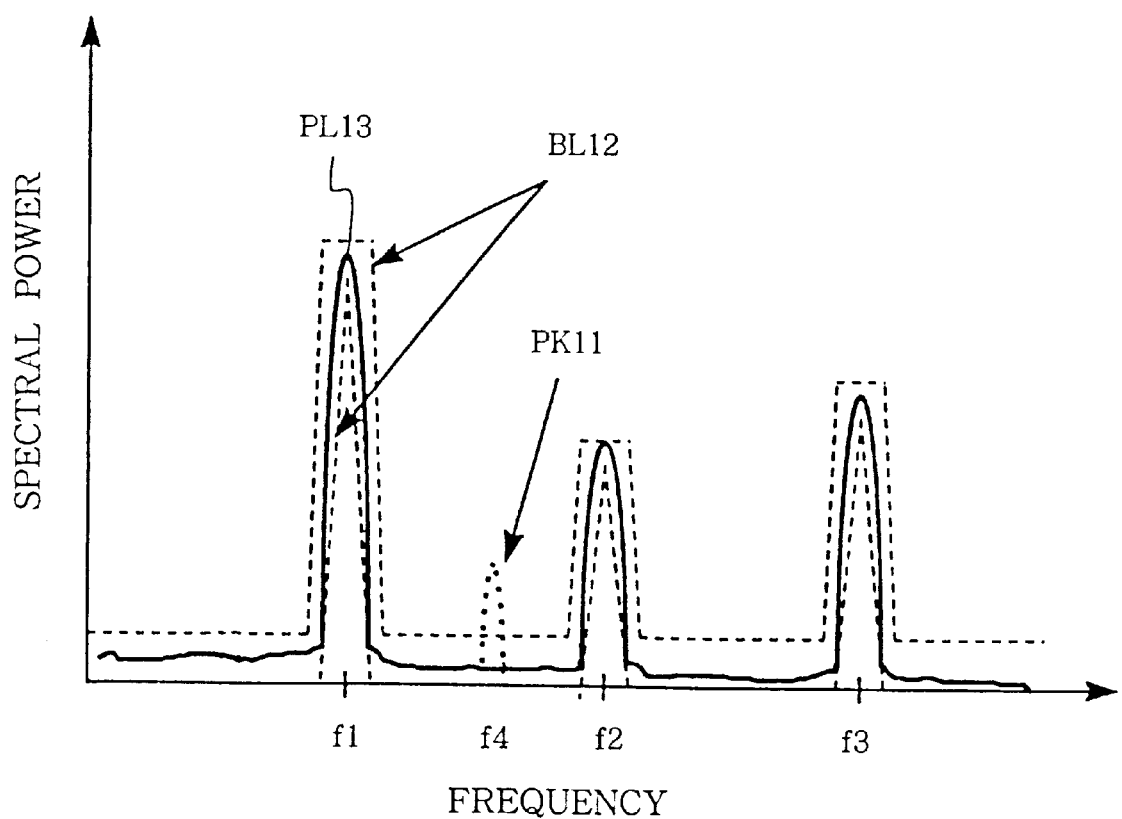
FIG. 12 is a graph showing a frequency spectrum obtained from another fault product.

Otherwise, the diagnostic unit 9 diagnoses the product 4 on the basis of lack of a peak, unexpected peak, an offset of a peak from a predetermined frequency and unexpected spectral powers at the peaks of the frequency spectrum. FIG. 12 illustrates a frequency spectrum of a product diagnosed to be fault on the basis of unexpected peak. Broken lines BL12 indicate a range of spectral powers obtained from excellent products. If the frequency spectrum falls within the range indicated by broken lines BL12, the diagnostic system 9 diagnoses the product to be excellent. Plots PL13 is representative of the frequency spectrum obtained from an excellent product. However, if the frequency spectrum has a peak PK11 at f4, the diagnostic system 9 diagnoses the product to be fault.

As will be appreciated from the foregoing description, the diagnosis is reliable, because the abnormal current makes the frequency spectrum clearly distinguishable. Moreover, the diagnosis is completed within time shorter than that of the first prior art diagnosis system, because the electric power PW is consumed by a component circuitry under application of each test signal.

Especially, the observation of the dynamic abnormal current AB2 results in the trouble shooting of the component transistor such as the offset timing of switching action. The analyst has felt the analysis of switching timing difficult. Only the direct measurement with a synchronoscope allowed the analyst to access the transistor to be investigated, and such an investigation is quite difficult. The present invention provides an effective tool to the analyst, and the analyst easily investigates component transistors of an integrated circuit to see whether or not the switching action takes place at predetermined timings.

Although a particular embodiments of the present invention has been shown and described, it will be apparent to those skilled in the art that various changes and modifications may be made without departing from the spirit and scope of the present invention.

Figure 13:
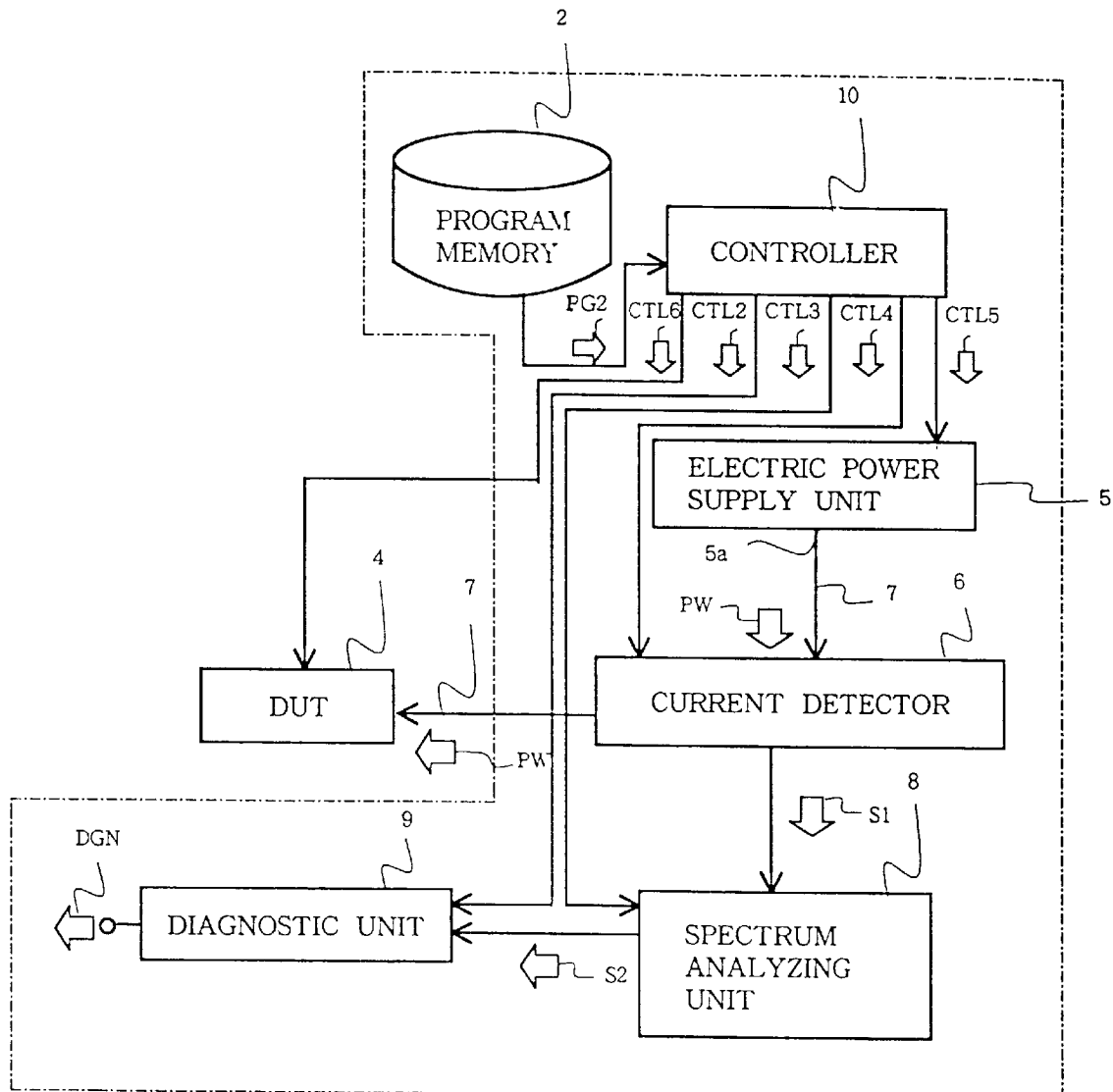
FIG. 13 is a schematic view showing another diagnosis system according to the present invention.

If the semiconductor integrated circuit device 4 has a self-test function, the LSI tester 3, the built-in self-testing circuit produces the test signal pattern, and applies the test signal pattern to the integrated circuit. The controller 10 supplies a control signal CTL6 to the semiconductor integrated circuit device 4, and the control signal CTL6 causes the semiconductor integrated circuit device 4 to enter into the self-test mode. If the control signal CTL6 is repeatedly applied to the semiconductor integrated circuit device 4, the self-testing circuit repeatedly generates the test signal pattern as similar to the LSI tester 3. Thus, the self-testing circuit carries out the generation of the test signal patterns, and the LSI tester 3, the test pattern memory 1 and the program sequence PG1 are deleted from the diagnosis system as shown in FIG. 13. Accordingly, the diagnostic method is modified from the method shown in FIG. 2. Steps S2/S3/S4 are replaced with step Sx (see FIG. 14), and the controller 10 instructs the product of semiconductor integrated circuit device 4 to enter into the self-test mode.

Figure 14:
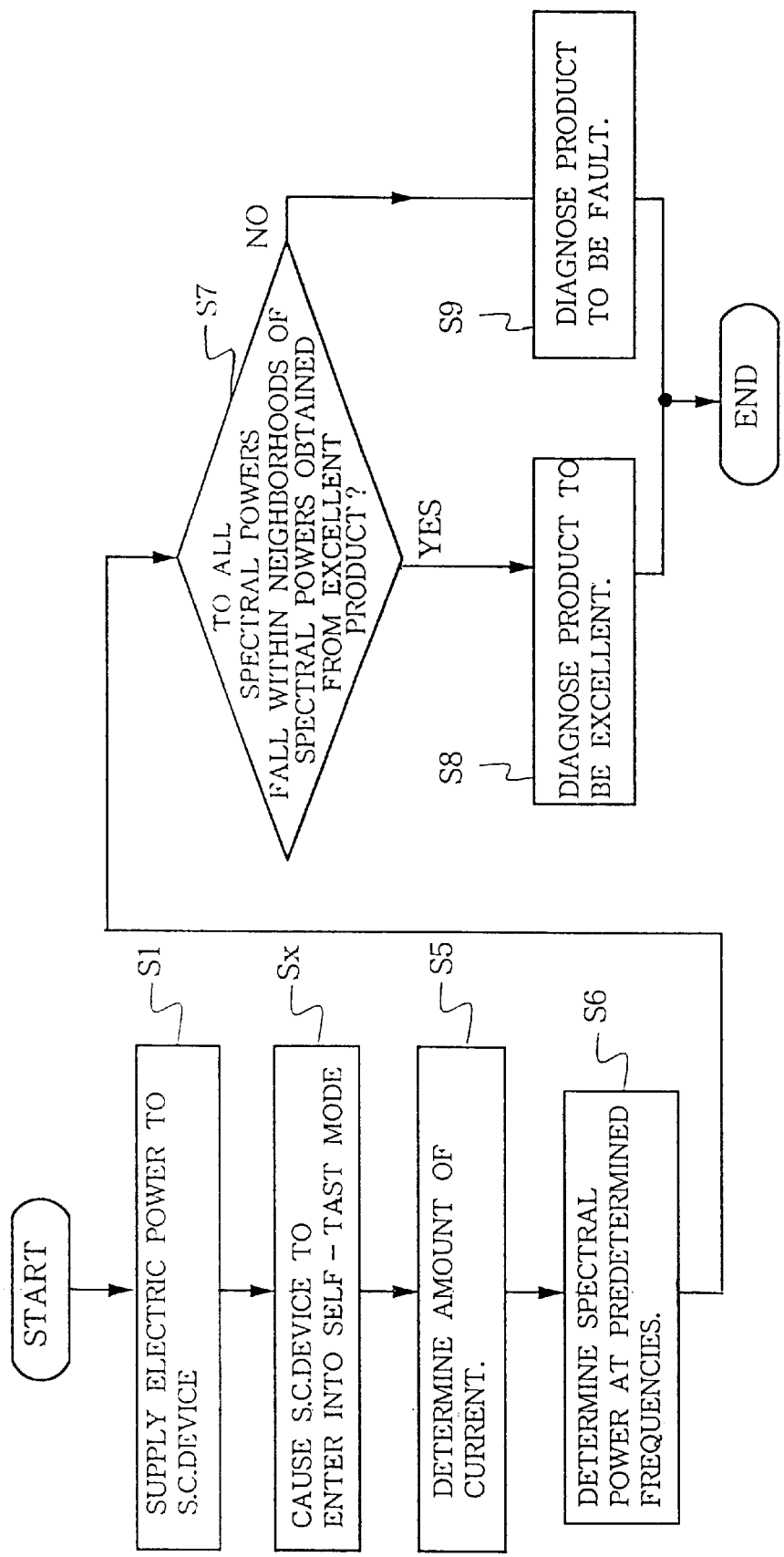
FIG. 14 is a flowchart showing a method realized by the diagnosis system shown in FIG. 13.

The description under the sub-titles of "Diagnosis System" and "Method of Diagnosis" is applicable to the diagnosis system shown in FIG. 13 and the method shown in FIG. 14.

The integrated circuit to be tested may be fabricated on an insulating substrate.

What is claimed is:

1. A diagnostic system for diagnosing an integrated circuit, comprising:

a power supplier connected to said integrated circuit, and supplying an electric power to circuit components of said integrated circuit;

a test signal generator connected to said integrated circuit, and applying a test signal pattern to said integrated circuit so as to make said integrated circuit operate;

an analyzer connected between said power supplier and said integrated circuit, and monitoring said electric power so as to determine a frequency spectrum of said electric power consumed by said integrated circuit and having spectral components at predetermined frequencies; and a diagnostic unit connected to said analyzer, and comparing said frequency spectrum with a reference frequency spectrum obtained from a non-failure integrated circuit to see whether or not said integrated circuit contains a fault.

2. The diagnosis system as set forth in claim 1, in which said test signal pattern is applied to said integrated circuit for a time period.

3. The diagnosis system as set forth in claim 2, in which said test signal generator repeatedly applies said test signal pattern at repetition periods each equal to said time period, and said predetermined frequencies are a fundamental frequency calculated from the repetition period and harmonics of said fundamental frequency.

4. The diagnosis system as set forth in claim 2, in which said test signal pattern includes a series of test signals sequentially applied to signal input terminals of said integrated circuit, and said series of test signals are repeatedly applied to said signal input terminals at repetition periods each equal to said time period.

5. The diagnosis system as set forth in claim 1, in which said integrated circuit contains a static fault causative of a static abnormal power consumption regardless of transistor actions of component transistors thereof, and said static abnormal power consumption makes said frequency spectrum different from said reference frequency spectrum.

6. The diagnosis system as set forth in claim 5, in which said component transistors are a kind of complementary transistor having a series of an n-channel type field effect transistor and a p-channel type field effect transistor, and said static abnormal power consumption takes place between a switching action of one of said component transistors and a switching action of another of said component transistors.

7. The diagnosis system as set forth in claim 6, in which said test signal pattern includes a series of test signals sequentially applied to said integrated circuit for a time period, and is repeatedly applied to said integrated circuit at repetition periods each equal to said time period so that said static abnormal power consumption is repeated at said repetition periods.

8. The diagnosis system as set forth in claim 1, in which said integrated circuit contains a dynamic fault causative of a dynamic abnormal power consumption due to a transistor action of a component transistor thereof, and said dynamic abnormal power consumption makes said frequency spectrum different from said reference frequency spectrum.

9. The diagnosis system as set forth in claim 8, in which said dynamic fault is due to a switching action of said component transistor at a certain timing offset from a target timing.

10. The diagnosis system as set forth in claim 9, in which said component transistor is a complementary field effect transistor having a series of a p-channel type field effect transistor and an n-channel type field effect transistor.

11. The diagnosis system as set forth in claim 8, in which said test signal pattern includes a series of test signals sequentially applied to said integrated circuit for a time period, and is repeatedly applied to said integrated circuit at repetition periods each equal to said time period so that said dynamic abnormal power consumption is repeated at said repetition periods.

12. The diagnosis system as set forth in claim 1, in which said test signal generator includes
  a data memory for storing pieces of data information used for generating said test signal pattern,
  a program memory for storing programmed instructions, and
  a tester connected to signal input terminals of said integrated circuit and sequentially executing said programmed instructions for producing said test signal pattern from said pieces of data information.

13. The diagnosis system as set forth in claim 12, in which said in which said data memory, said program memory and said tester are physically separated from a substrate where said integrated circuit is fabricated.

14. The diagnosis system as set forth in claim 1, in which said power supplier includes a power supply unit, and said power supply unit keeps a voltage level at an output terminal thereof constant.

15. The diagnosis system as set forth in claim 1, in which said analyzer includes an electric power measuring unit connected to said power supplier and producing a first signal representative of the magnitude of said electric power, and
  a spectrum analyzing unit connected between said electric power measuring unit and said diagnostic unit, determining said spectral components on the basis of said magnitude of said electric power and producing a second signal representative of said spectral components.

16. The diagnosis system as set forth in claim 15, in which said magnitude of said electric power is repeatedly varied together with test signals of said test signal pattern repeatedly applied to said integrated circuit at repetition periods, and said spectrum analyzing unit determines said spectral components at a fundamental frequency equal to the inverse of said repetition period and harmonics of said fundamental frequency.

17. The diagnosis system as set forth in claim 16, in which said electric power measuring unit has a resistor inserted into an electric power propagation path of said power supplier, and said resistor converts an electric power current flowing through said electric power propagation path to a voltage level serving as said first signal.

18. The diagnosis system as set forth in claim 16, in which said spectrum analyzing unit has a plurality of band-pass filters different in passband from one another, and said first signal is supplied to said plurality of band-pass filters.

19. The diagnosis system as set forth in claim 18, in which said band-pass filters respectively have passbands tuned to said fundamental frequency and said harmonics.

20. The diagnosis system as set forth in claim 15, in which said spectrum analyzing unit is a fast Fourier transformer.

21. A diagnostic system for diagnosing an integrated circuit having a self-test mode, comprising:
  a power supplier connected to said integrated circuit, and supplying an electric power to circuit components of said integrated circuit;
  an analyzer connected between said power supplier and said integrated circuit, and monitoring said electric power so as to determine a frequency spectrum of said electric power consumed by said integrated circuit under application of a test signal pattern in said self-test mode and having spectral components at predetermined frequencies; and
  a diagnostic unit connected to said analyzer, and comparing said frequency spectrum with a reference frequency spectrum obtained from a non-failure integrated circuit to see whether or not said integrated circuit contains a fault.

22. The diagnosis system as set forth in claim 21, further comprising a controller applying a control signal so as to cause said integrated circuit to enter into said self-test mode.

23. The diagnosis system as set forth in claim 22, in which said controller repeatedly applies said control signal to said integrated circuit.

24. The diagnosis system as set forth in claim 23, in which said control signal is applied to said integrated circuit at constant repetition periods.

25. The diagnosis system as set forth in claim 21, in which said integrated circuit contains a static fault causative of a static abnormal power consumption regardless of transistor actions of component transistors thereof, and said static abnormal power consumption makes said frequency spectrum different from said reference frequency spectrum.

26. The diagnosis system as set forth in claim 25, in which said component transistors are a kind of complementary transistor having a series of an n-channel type field effect transistor and a p-channel type field effect transistor, and said static abnormal power consumption takes place between a switching action of one of said component transistors and a switching action of another of said component transistors.

27. The diagnosis system as set forth in claim 26, in which said test signal pattern includes a series of test signals sequentially applied to said integrated circuit for a time period, and is repeatedly applied to said integrated circuit at repetition periods each equal to said time period so that said static abnormal power consumption is repeated at said repetition periods.

28. The diagnosis system as set forth in claim 21, in which said integrated circuit contains a dynamic fault causative of a dynamic abnormal power consumption due to a transistor action of a component transistor thereof, and said dynamic abnormal power consumption makes said frequency spectrum different from said reference frequency spectrum.

29. The diagnosis system as set forth in claim 28, in which said dynamic fault is due to a switching action of said component transistor at a certain timing offset from a target timing.

30. The diagnosis system as set forth in claim 29, in which said component transistor is a complementary field effect transistor having a series of a p-channel type field effect transistor and an n-channel type field effect transistor.

31. The diagnosis system as set forth in claim 28, in which said test signal pattern includes a series of test signals sequentially applied to said integrated circuit for a time period, and is repeatedly applied to said integrated circuit at repetition periods each equal to said time period so that said dynamic abnormal power consumption is repeated at said repetition periods.

32. A method for diagnosing an integrated circuit, comprising the steps of:
   a) applying an electric power to said integrated circuit so as to make circuit components thereof responsive to a test signal pattern;
   b) applying said test signal pattern to said integrated circuit so that said integrated circuit operates;
   c) determining a frequency spectrum of said electric power consumed by said integrated circuit; and
   d) comparing said frequency spectrum with a reference frequency spectrum observed in an excellent product to see whether or not said integrated circuit contains a fault.

33. The method as set forth in claim 32, in which said steps b), c) and d) are repeated so that a difference between said frequency spectrum and said reference frequency spectrum is also repeated.

34. The method as set forth in claim 33, in which said test signal pattern is repeatedly applied to said integrated circuit at repetition periods, and said frequency spectrum has a fundamental spectral component at a fundamental frequency equal to the inverse of said repetition period and harmonic spectral components at harmonics of said fundamental frequency.

35. The method as set forth in claim 34, in which said integrated circuit is diagnosed to be fault in said step d) when one of said fundamental spectral component and said harmonic spectral components is different in magnitude from a corresponding spectral component of said reference frequency spectrum.

36. The method as set forth in claim 34, in which said integrated circuit is diagnosed to be fault in said step d) when said frequency spectrum has a peak at one of said harmonics.

37. The method as set forth in claim 34, in which said integrated circuit is diagnosed to be fault in said step d) when one of said spectral components has a width wider than that of a corresponding spectral component of said reference frequency spectrum.

38. The method as set forth in claim 32, in which a basic circuit component of said integrated circuit is a complementary transistor having a series combination of a p-channel type field effect transistor and an n-channel type field effect transistor.

39. The method as set forth in claim 32, in which said integrated circuit has a self-test mode, and said step b) is carried out inside of said integrated circuit.

40. An information storage medium storing a program sequence for diagnosing an integrated circuit, comprising the steps of:
   a) applying an electric power to said integrated circuit so as to make circuit components thereof responsive to a test signal pattern;
   b) applying said test signal pattern to said integrated circuit so that said integrated circuit operates;
   c) determining a frequency spectrum of said electric power consumed by said integrated circuit; and
   d) comparing said frequency spectrum with a reference frequency spectrum observed in an excellent product to see whether or not said integrated circuit contains a fault.

41. The method as set forth in claim 40, in which said steps b), c) and d) are repeated so that a difference between said frequency spectrum and said reference frequency spectrum is also repeated.

42. The method as set forth in claim 41, in which said test signal pattern is repeatedly applied to said integrated circuit at repetition periods, and said frequency spectrum has a fundamental spectral component at a fundamental frequency equal to the inverse of said repetition period and harmonic spectral components at harmonics of said fundamental frequency.

43. The method as set forth in claim 42, in which said integrated circuit is diagnosed to be fault in said step d) when one of said fundamental spectral component and said harmonic spectral components is different in magnitude from a corresponding spectral component of said reference frequency spectrum.

44. The method as set forth in claim 42, in which said integrated circuit is diagnosed to be fault in said step d) when said frequency spectrum has a peak at one of said harmonics.

45. The method as set forth in claim 42, in which said integrated circuit is diagnosed to be fault in said step d) when one of said spectral components has a width wider than that of a corresponding spectral component of said reference frequency spectrum.

46. The method as set forth in claim 40, in which a basic circuit component of said integrated circuit is a complementary transistor having a series combination of a p-channel type field effect transistor and an n-channel type field effect transistor.

47. The method as set forth in claim 40, in which said integrated circuit has a self-test mode, and said step b) is carried out inside of said integrated circuit.

\* \* \* \* \*